United States Patent [19]
Mikkelsen et al.

[11] Patent Number: 5,957,292
[45] Date of Patent: Sep. 28, 1999

[54] WAFER ENCLOSURE WITH DOOR

[75] Inventors: Kirk J. Mikkelsen, Chanhassen; Michael S. Adams, Belle Plaine; Greg Bores, Prior Lake; Brian S. Wiseman, Glencoe, all of Minn.

[73] Assignee: Fluoroware, Inc., Chaska, Minn.

[21] Appl. No.: 08/904,660

[22] Filed: Aug. 1, 1997

[51] Int. Cl.⁶ .................................................. B65D 85/30
[52] U.S. Cl. ........................ 206/710; 206/454; 206/711; 414/217
[58] Field of Search .................................. 206/710, 711, 206/712, 454; 141/98; 414/217, 404, 417

[56] References Cited

U.S. PATENT DOCUMENTS

| | | |
|---|---|---|
| 4,674,939 | 6/1987 | Maney et al. . |
| 4,739,882 | 4/1988 | Parikh et al. . |
| 4,995,430 | 2/1991 | Bonora et al. . |
| 5,433,574 | 7/1995 | Kawano et al. . |
| 5,482,161 | 1/1996 | Williams et al. ........................ 206/711 |
| 5,570,987 | 11/1996 | McKenna . |
| 5,621,982 | 4/1997 | Yamashita et al. . |
| 5,711,427 | 1/1998 | Nyseth ..................................... 206/710 |
| 5,740,845 | 4/1998 | Bonora et al. ........................... 206/710 |

FOREIGN PATENT DOCUMENTS

PCT/US90/
01995  4/1990  WIPO .

*Primary Examiner*—S. Thomas Hughes
*Assistant Examiner*—Jermie E. Cozart
*Attorney, Agent, or Firm*—Douglas J. Christensen

[57] ABSTRACT

A sealable enclosure for wafers has a door with an easily accessible and disassembleable latching mechanism which utilizes a minimal number of moving parts. The door includes an enclosure with a cammed member rotatable on a post and in engagement with a pair of latching arms that extend, retract, move upwardly and downwardly or forwardly and rearwardly depending on whether the door is a front side door or a bottom door. The movement of the latching arms is accomplished by cammed portion of the cammed member configured to move cam follower portions of the latching arms in an axial direction with respect to the cammed member and in a radial direction. The latching arm pivots on a fulcrum within the enclosure. The latching mechanism is accessible through a panel that attaches by integral detents on the panel that cooperate with recesses on the interior edge walls of the door enclosure. The rotatable member has a slotted center and is secured on a T-shaped post extending from the enclosure by placement on the post in an insertion rotational position. When assembled the rotation of the cammed member is restricted to the operative range by stops on the enclosure.

10 Claims, 7 Drawing Sheets

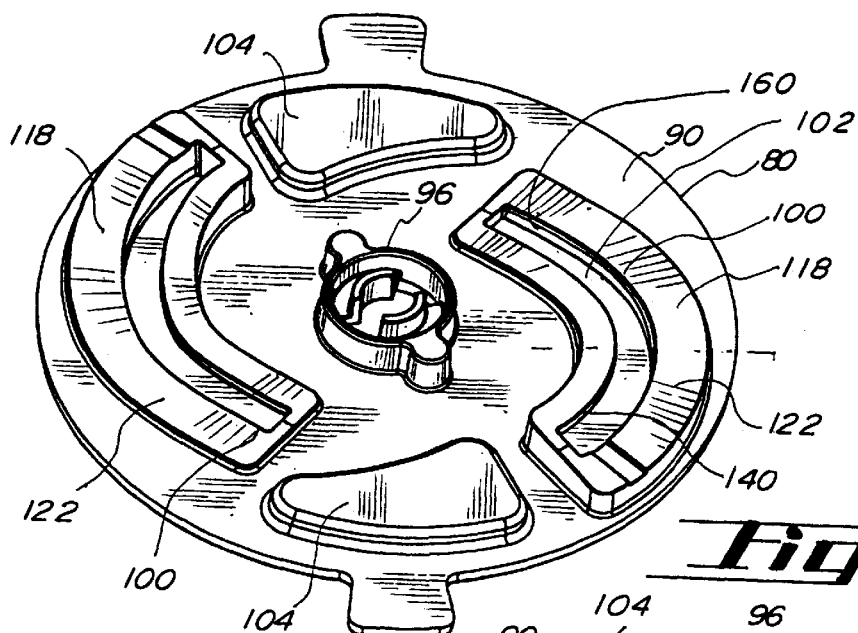
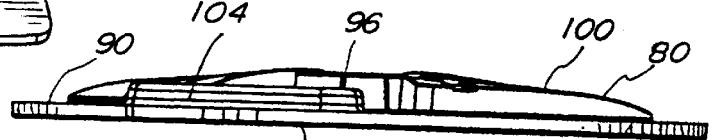
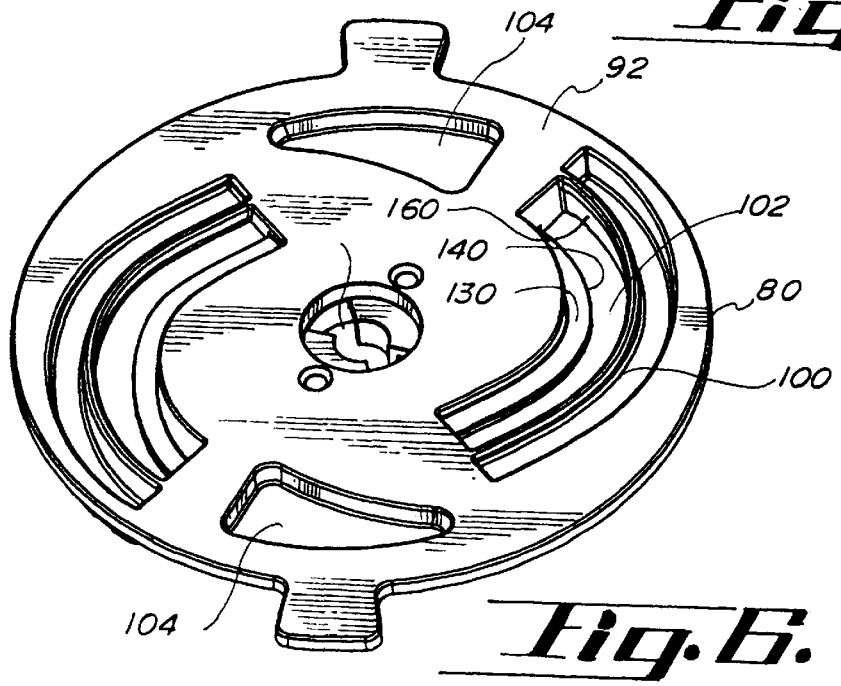

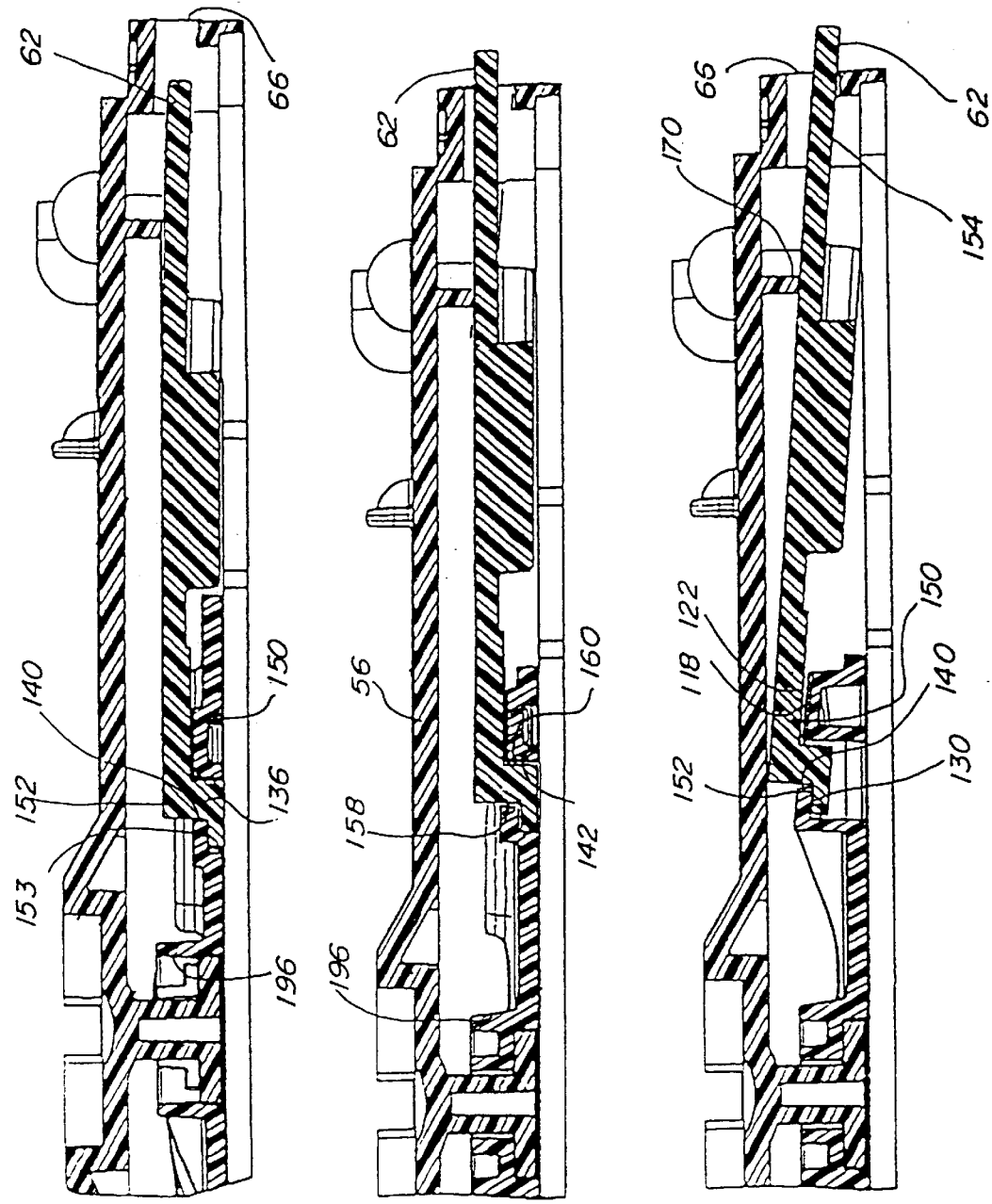

WAFER ENCLOSURE WITH DOOR

BACKGROUND OF THE INVENTION

This invention relates to wafer carriers. More particularly it relates to sealable wafer enclosures having doors with latching mechanisms.

Various methods have been utilized for enclosing wafers in containers for storage and shipping. Some containers have rigid bodies with vertical slots for receiving the wafers and have flexible snap-on covers. These containers are generally not suitable for use in applications where the wafers are not to be exposed to the ambient atmosphere.

For wafers in the range of 200 mm and smaller, containers known as SMIF (standardized mechanical interface) pods 20 such as shown in FIG. 1, have been utilized to provide a clean sealed mini-environment that allows transfer of wafers into processing equipment without exposing the wafers to the ambient atmosphere. Examples of these pods are shown in U.S. Pat. Nos. 4,532,970 and 4,534,389. Such SMIF pods typically utilize a transparent container portion 34 with a lower door frame portion 35 configured as a flange defining an open bottom and a latchable door 36 that closes the open bottom. The door frame portion 35 clamps onto processing equipment and a door on the processing equipment attaches to the lower SMIF pod door. Both doors may be simultaneously lowered downwardly from the shell into a sealed processing environment in said processing equipment. A separate H-bar carrier 38 positioned on the top surface 40 of the SMIF pod door 36 and loaded with wafers is lowered with the pod door for accessing and processing said wafers.

The semiconductor processing industry is moving toward utilization of larger wafers, specifically 300 mm wafers. Transport modules for such wafers, by way of developing industry standards, are expected to utilize a front opening door for insertion and removal of the wafers as opposed to a bottom door that drops downwardly from the module. Referring to FIG. 2, such a front opening enclosure is shown. Such an enclosure has analogous components to the SMIF pod although the wafers may be supported within the container portion 34 without a separate removable carrier.

Various configurations of door enclosures and latching mechanisms for sealable enclosures are known in the art. Generally, these have the disadvantage that they are not easily disassembled, they have numerous moving parts, and they utilize metallic parts including fasteners. The use of metallic fasteners or other metal parts is highly undesirable in semiconductor wafer carriers or containers. Metallic parts generate highly damaging particulates when rubbed or scrapped. Assembly of a module with fasteners causes such rubbing and scrapping. Thus, the use of metal fasteners or other metal parts in wafer enclosures is to be avoided.

Latching mechanisms known in the art will often use rotatable cammed members. These cammed members have typically been formed of planar plastic plates with elongate recesses defining cam surfaces. These cam surfaces only provided motion of the cam follower in one direction, typically a single back and forth radial direction that translated to an extension and retraction of the latching portions. Other means, which typically added substantially component parts, were necessary for providing a motion of the latching portions in a direction away and towards the container portion for securing and sealing the door. Such additional component parts increase manufacturing costs, increase the complexity of the latching mechanism, increase the difficulty in assembly and disassembly, and increase the number of rubbing and scrapping surfaces which generate more particulates.

Although enclosures as described above are utilized in relatively clean environments, such enclosures will over time accumulate contaminants on and in the enclosure and in the interior of the door enclosure ultimately requiring cleaning. Such contaminants may be created by rubbing of parts such as the operation of the door latching mechanism as described above, by the wafers being loaded and unloaded on the wafer shelves, and by the door being engaged and disengaged with the container portion. The numerous parts in conventional latching mechanisms, the difficulty of disassembly of the doors, and the use of metallic fasteners make the cleaning of such doors difficult. An easily disassembleable door, with an easily disassembleable latching mechanism, and with minimal moving parts is needed.

The door with the features as disclosed and claimed herein are suitable for use with either of the type of enclosure as described above and satisfy the needs as described.

SUMMARY OF THE INVENTION

A sealable enclosure for wafers has a door with an easily accessible and disassembleable latching mechanism which utilizes a minimal number of moving parts. The door includes an enclosure with a cammed member rotatable on a post and in engagement with a pair of latching arms that extend, retract, move upwardly and downwardly or forwardly and rearwardly depending on whether the door is a front side door or a bottom door. The movement of the latching arms is accomplished by cammed portion of the cammed member configured to move cam follower portions of the latching arms in an axial direction with respect to the cammed member and in a radial direction. The latching arm pivots on a fulcrum within the enclosure. The latching mechanism is accessible through a panel that attaches by integral detents on the panel that cooperate with recesses on the interior edge walls of the door enclosure. The rotatable member has a slotted center and is secured on a T-shaped post extending from the enclosure by placement on the post in an insertion rotational position. When assembled, the rotation of the cammed member is restricted to the operative range by stops on the enclosure.

A feature and advantage of the invention is that the door is easily disassembled and assembled for cleaning or other purposes.

An additional advantage and feature of the invention is that the latching mechanism utilizes an absolute minimal number of parts all of which may be injection molded.

An additional advantage and feature of the invention is that no metallic parts or fasteners are needed or used in the door.

BRIEF DESCRIPTION OF THE DRAWINGS

FIG. 4 is a perspective view of the rotatable cammed member.

FIG. 5 is a side elevational view of the rotatable cammed member of FIG. 4.

FIG. 6 is a perspective view of the bottom side of the rotatable cammed member.

FIG. 7A is a cross-sectional view taken at 7—7 of FIG. 3A.

FIG. 7B is the cross-sectional view of FIG. 7A with the latching portion in an extended position.

FIG. 7C is the cross-sectional view of FIGS. 7A and 7B with the latching portion in an extended and tilted position.

DETAILED SPECIFICATION

Figure 1:
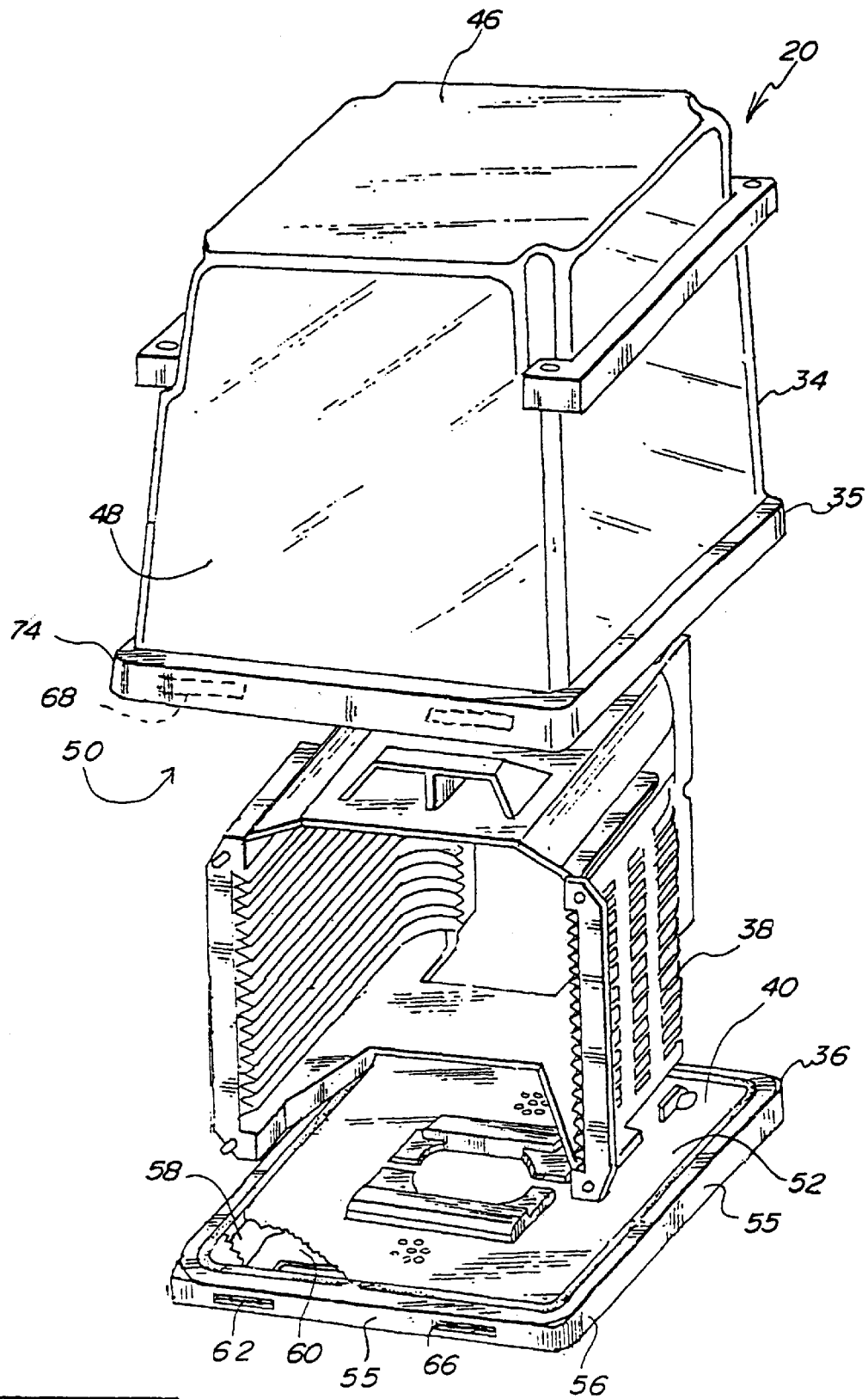
FIG. 1 is a perspective view of a prior art SMIF pod.
Figure 2:
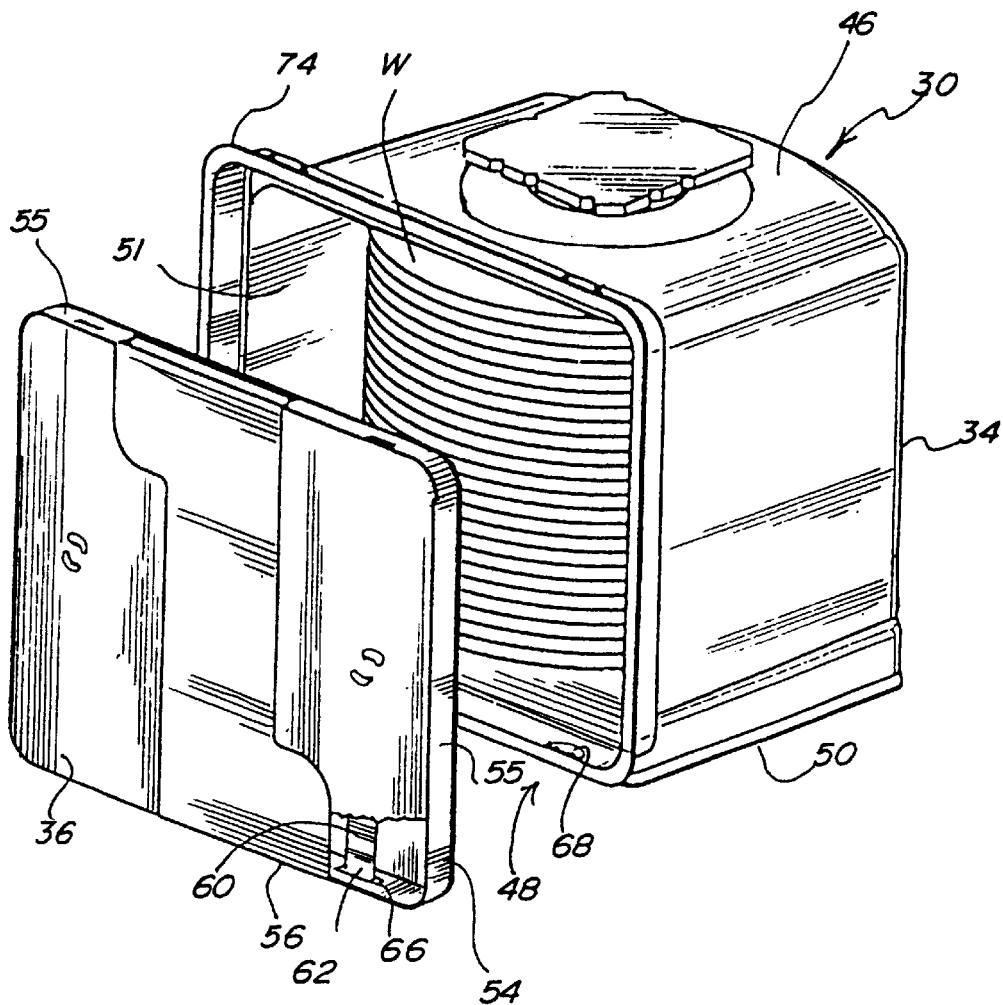
FIG. 2 is a perspective view of a prior art transport module.

Prior art FIGS. 1 and 2 show a bottom opening SMIF pod 20 and a front opening transport module 30 respectively for which the invention is highly suitable. Each sealable enclosure has a container portion 34 and a cooperating door 36. The SMIF pod 20 also has a separate wafer carrier 38 which is a H-bar carrier, well known in the art, which seats on the top surface 40 of the door 36.

Each container portion 34 and each enclosure has a top side 46, a front side 48, and a bottom side 50. In the SMIF pod the bottom side 50 is open for receiving the wafer carrier 38 and the door 36. In the transport module 30 the front side 48 is open and is closed by the door 36.

The doors have an inwardly facing side 52, an outwardly facing side 53, and a periphery 54 comprised of four sidewalls 55. Each of the doors 36 comprise an enclosure 56 with an open interior 58 which contains a latching mechanism 60, a portion of which is shown in FIGS. 1 and 2. The latching mechanism includes a latching portion 62 which is extendable out of slots 66 to engage into latching portion receivers 68 located in the door frame portion 74 of the container portion 34.

Figure 3A:
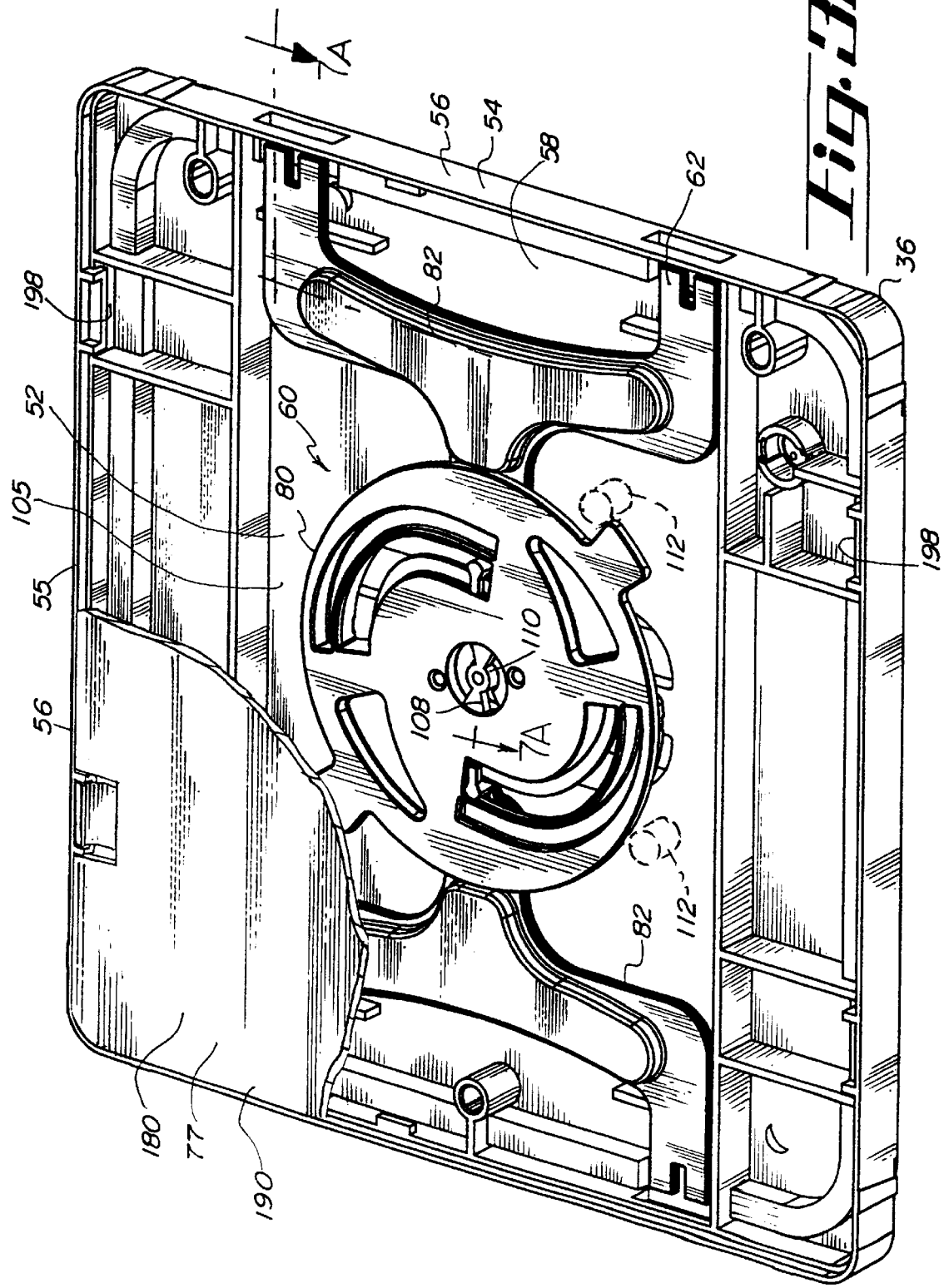
FIG. 3A is a perspective view of a door with a portion of the cover removed.
Figure 3B:
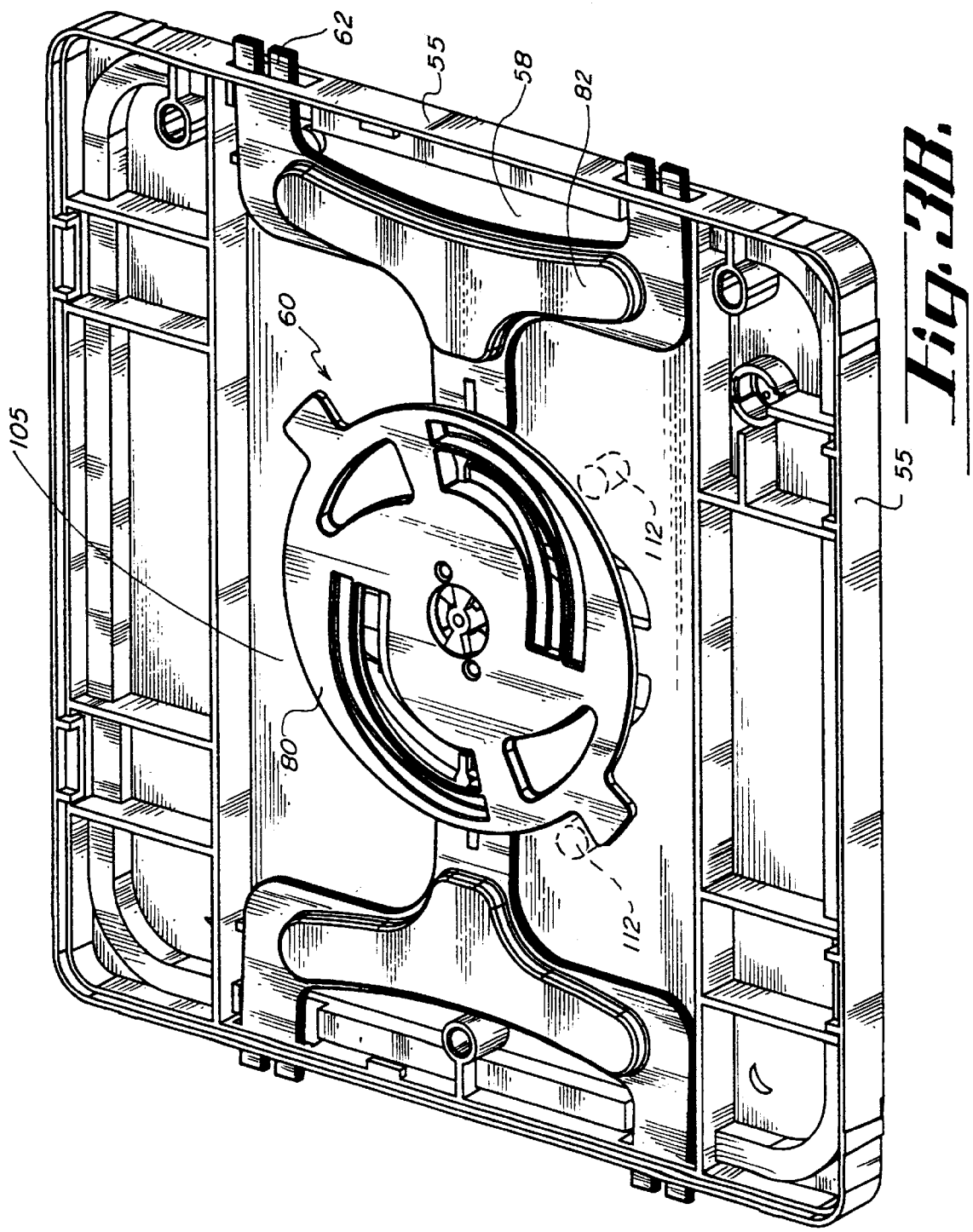
FIG. 3B is a perspective view of a door with a cover removed.

Now specifics of improvements constituting the invention will be discussed. Referring to FIG. 3A and 3B, a door 36 with an outside facing panel 77 cutaway and removed reveals the interior 58 which contains the latching mechanism 60. The latching mechanism 60 is comprised of a rotatable cammed member 80 and a pair of latching arms 82. Details of the cammed member 80 are further disclosed in FIGS. 4, 5, 6, 7A, 7B, and 7C. The cammed member 80 has a top surface 90, a bottom surface 92, a central hub portion 96, cammed portions 100, coupling apertures 102, and structural relief portions 104.

Figure 8:
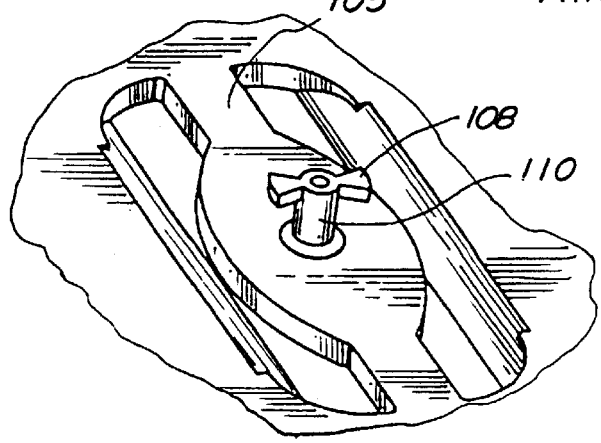
FIG. 8 is a perspective view of the inside panel of the door showing the T-shaped post.

The top surface 90 of the cam member 80 faces towards the inside door panel 105 of the inwardly facing side 52. Positioned in the hub 96 of the cam member 80 is a slot 106 which is sized to fit over the retainer portion 108 of the T-shaped post 110 which extends from the enclosure 56 at the inside door panel 105. See FIG. 8.

The cammed member 80 assembles onto the post 110 at a rotational insertion position such that the slot is aligned with the retainer portion 108 of the post 110. In this position the cammed wheel is then rotated slightly to move into an operative rotation range which is defined by the rotational positions between and including the limit positions as is shown in FIGS. 3A and 3B. The rotational limits are provided by stops extending from the enclosure indicated by dashed lines with the numeral 112.

Referring to FIGS. 4, 7A, 7B, and 7C the cammed portion 100 has a pair of first engagement portions 118 on an elongate strip 122. The height of the elongate strip 122 and correspondingly the height of the engagement portions 118 varies with the radial position on the strip. The cammed member 80 also has a supplemental first engagement portion 130 which cooperates with the first engagement portions 118 in the capture of and in guiding the cam follower portions 136 of the latching arms 82. The cammed member also has a second engagement portion 140 which operates in conjunction with a supplemental second engagement portion 142. These engagement portions engage and capture the cam follower portion 136 of the latching arms 82.

The latching arms are disclosed in FIGS. 3A, 3B, 7A, 7B, 7C, and 9. The latching arms comprise a first ends 152 opposite second ends 154, a cam follower portion 136 on the first end, and the latching portions 62 on the opposite second ends. The cam follower portion has a generally S-shaped cross-section that is shown in FIG. 7A, 7B, and 7C to allow assembly into the cammed member and retention and continual engagement therein. The cam follower portion has a first engagement surface 150 which engages the first engagement portion 118 of the cammed member 80 and a supplemental first engagement surface 153 which engages the supplemental first engagement portion 130. Additionally, a second engagement surface 158 engages with the second engagement portion 140 of the rotatable cammed member 80 and a supplemental second engagement surface 160 contacts and engages the supplemental second engagement portion 142.

Referring to FIGS. 3A, 3B, 7A, 7B, and 7C, the movement of the latching arms with respect to the rotatable cammed member 80 are illustrated. FIGS. 3A and 7A show the latching portions 62 in a fully retracted position within the door enclosure 56. FIG. 7B shows the latching portion 62 in an extended position and in a position toward the inside door panel 105 and correspondingly the interior of the container portion. FIGS. 7C and 3B show the latching arms 62 in an extended position and in a position moved distally from the inside door panel 105 and correspondingly the interior of the container portion and the container portion in general. This motion away from the inside door panel 105 operates to urge the entire door 36 inwardly towards the interior of the container portion such that a fully secured and sealing relationship is achieved.

As is illustrated in 7A, 7B, and 7C, the initial extension of the latching portion is accomplished by the initial rotation of the rotatable cammed member from the position shown in FIG. 3A approximately 20°. The cam portion in such a position is pushed in the radial direction by the second engagement portion 140. From this point the height of the first engagement portion 118 of the cammed portion 100 gradually increases to the height as shown in FIG. 7C. At this point the cammed portion is raised upwardly as shown in FIG. 7C and the latching arm pivots about the fulcrum 170 which is integral with the inside door panel 105. Said pivoting about the fulcrum 170 causes the latching portion 62 to move in an opposite direction from the cam portion movement which affects the pulling inwardly of the door into the full engagement position with the door frame portion and correspondingly the container portion.

As can best be seen in FIGS. 5 and 7C, the first engagement portion 118 and the supplemental first engagement portion 130 are tilted to fully match the tilt of the first engagement surface 150 and supplemental first engagement surface 152 of the latching arm as the latching arm pivots about the fulcrum 170. This allows full distribution of the loading of the latching arm on the cammed member and thus distributes over the larger area said loading to minimize particle generation due to the rubbing of the component parts.

Figure 10:
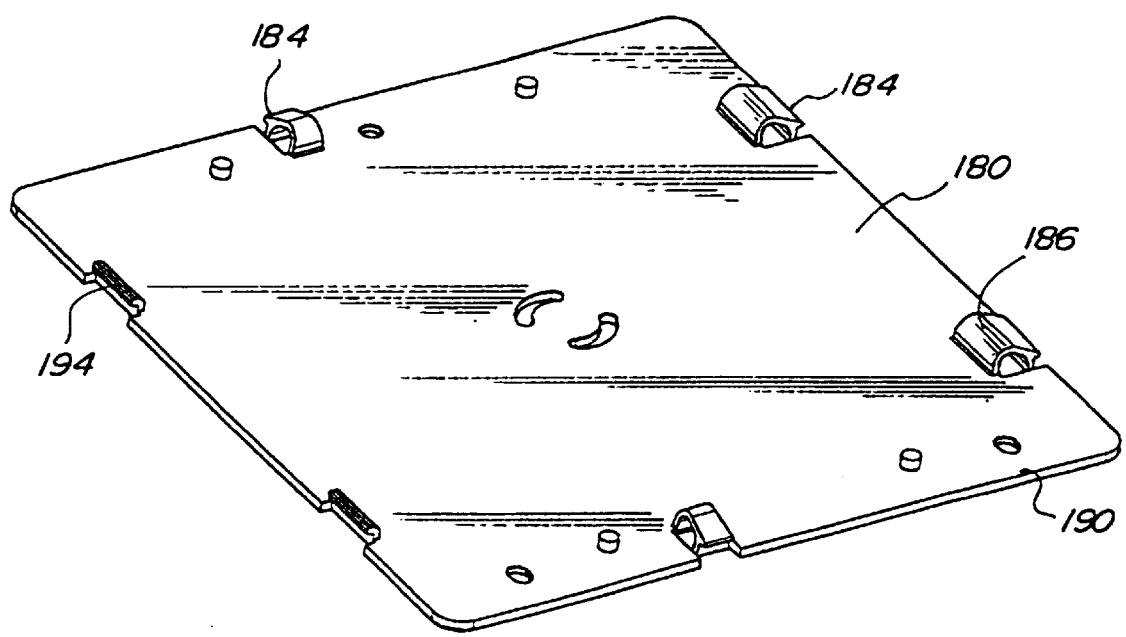
FIG. 10 is a perspective view of the front panel cover.
Figure 9:
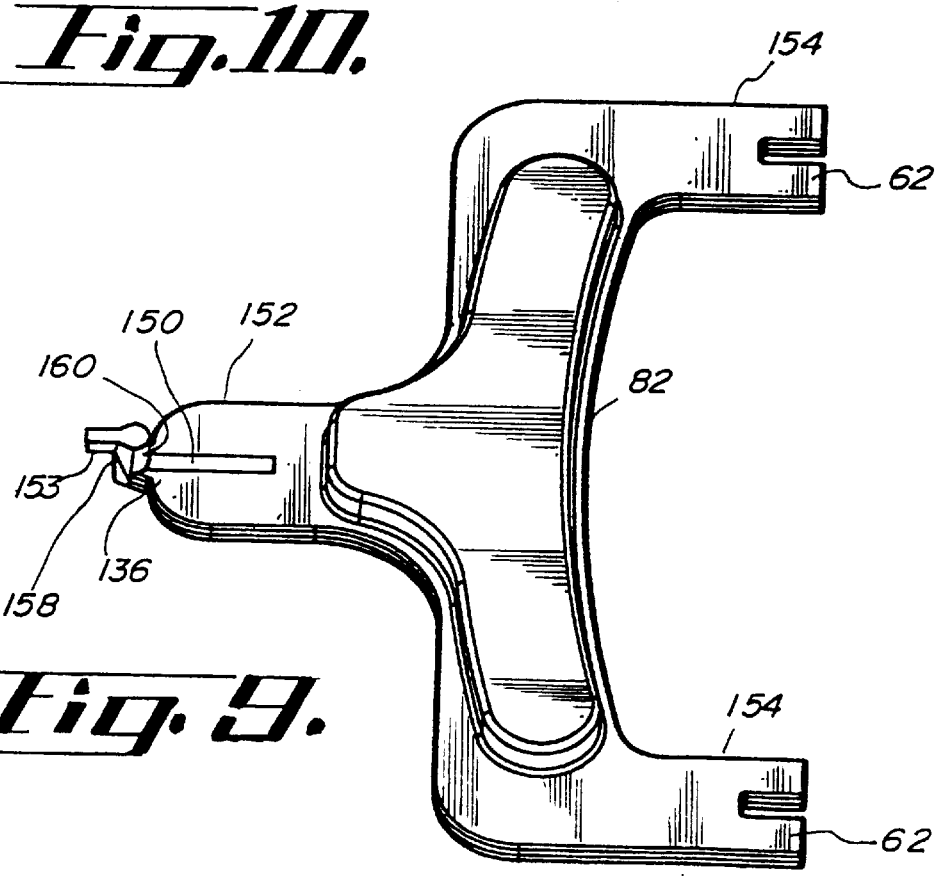
FIG. 9 is a perspective view of a latching arm.

Referring to FIGS. 3A and 10, details of the construction and latching of the outside door panel 180 are disclosed. The door panel 180 is comprised of plurality of detents 184 positioned on spring members 186 which are integral with said detents and the rest of the door panel 180. Said detents and spring members are positioned on the outside edge portion 190 of the door panel. The door panel also has a pair of catches 194 which do not have the associated spring members 186. The door panel is assembled onto the side wall 55 of the door enclosure 56 initially with the catch members 194 being engaged with cooperating recesses 198 on the upper or lower periphery. The door panel is then rotated downwardly such that the detents 184 opposite the catch members and the detents 184 on the side of the door panel adjacent the catch members may be positioned adjacent their respective recesses in the door enclosure periphery 54. The detents are then snapped in place to secure the door panel to the periphery without the use of metallic fasteners. The detents and spring members as well as the catch members are suitably sized such that when the door is latched in place the spring members are under loading in both a direction planar with the door panel 180 and also in a direction normal to the door panel. Such loading both retains the door panel in engagement with the periphery and also allows the detents to disengage outwardly from the door enclosure upon retraction of the detent. This constitutes an essentially automatic and convenient separation of the door panel from the periphery 54 facilitating removal of the door panel.

The component parts as discussed above are intended to be formed of injection molded plastic materials such as glass and/or carbon fiber filled nylon or polycarbonate or the above plastics without the fillers or with PTFE filler. The parts may also be suitably be machined.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. In combination, a sealable enclosure for semiconductor wafers having a cooperating door and an improved latching mechanism for said door, the enclosure generally comprising a container portion with an open interior and a generally rectangular door frame portion defining an open side, the door frame portion having at least two latch receivers positioned opposite from each other with respect to the open side; the cooperating door comprising a door enclosure having an outer periphery sized for insertion in the door frame portion, the door periphery having at least two openings corresponding to the latch receivers on the door frame portion; the improved latching mechanism comprising:

a) an integral latching arm comprising an "S" shaped cam follower portion on one end and a latch portion on the opposite end, the cam follower portion having a first cam engagement surface facing substantially radially inward and a first supplemental cam engagement surface opposite the first cam engagement surface and facing substantially radially outward, a second cam engagement surface facing substantially axially upward and a second supplemental cam engagement surface facing substantially axially downward, said cam engagement surfaces located on the S-shaped cam follower portion; and b) a rotatable cammed member in an interior of the door enclosure rotatably attached to the door enclosure and rotatable from exterior of said door, the cammed member having a pair of substantially axially facing cam surfaces that slidingly engage and cooperate with both the second cam engagement surface and the second supplemental cam engagement surface of the S-shaped cam follower, the cammed member further has a pair of substantially radially facing and oppositely facing cam surfaces that slidingly engage and cooperate with the first cam engagement surface and the first supplemental cam engagement surface of the S-shaped cam follower; whereby the pair of substantially radially facing surfaces and the pair of substantially axially facing surfaces combine to engage and capture the S-shaped cam follower portion.

2. The combination of claim 1 wherein the rotatable cammed member is centrally positioned in the door enclosure and wherein the door enclosure comprises two of the integral latching arms, the arms extending in opposite directions.

3. The combination of claim 2 wherein each of the latching arms is Y-shaped.

4. The combination of claim 1 wherein the door an enclosure contains the latching mechanism, the door enclosure having a door enclosure periphery with a plurality of recesses and a door panel having a plurality of detents positioned for cooperating with the plurality of recesses whereby the door panel snaps into position in the door enclosure without the use of metallic fasteners.

5. The combination of claim 4 wherein the rotatable cammed member is centrally positioned in the door enclosure and wherein the door enclosure comprises two of the integral latching arms, the arms extending in opposite directions, whereby the door is formed of not more than five separate components.

6. The combination of claim 4 wherein the rotatable cammed member is centrally positioned in the door enclosure and wherein the door enclosure comprises two of the integral latching arms, whereby the latching mechanism comprises not more than three moving components.

7. The combination of claim 1, wherein the container portion comprises a plurality of wafer supports defining horizontal shelves, and wherein the open side is at the front of the container portion.

8. A sealable enclosure for containing wafers, the enclosure comprising a container portion with an open bottom side and cooperating door for closing said open bottom side, the door having a periphery and a planar inwardly facing horizontal surface and further having a latching mechanism, in an interior portion thereof the latching mechanism having a cammed member and a latching arm with a S-shaped cam follower portion at one end of the latching arm and a latching portion at the opposite end, the S-shaped cam follower portion engaged and captured with the cammed member, the cammed member having a cammed portion configured to move the latching arm in a radially outwardly direction and in an axial direction as the cammed member is rotated whereby the latching portion is extendable initially outwardly from said door when said door is in place at said open side and the latching portion is then extendable in a direction away from said interior portion of said door for pulling the door into secure engagement with said container portion as said cammed member is rotated.

9. A sealable enclosure for containing wafers, the enclosure comprising a container portion with an open front side and cooperating door for closing said open front side, the door having a periphery and a planar inwardly facing vertical surface and further having a latching mechanism, in an interior portion thereof the latching mechanism having a cammed member and a latching arm with an S-shaped cam follower portion at one end of the latching arm and a latching portion at the opposite end, the S-shaped cam follower portion engaged and captured with the cammed member, the cammed member having a cammed portion configured to move the latching arm in an outwardly direction and in an axial direction as the cammed member is rotated whereby the latching portion is extendable outwardly from the periphery of said door when said door is in place at said open side and the latching portion is then extendable in a direction away from said interior portion of said door for pulling the door into secure engagement with said container portion as said cammed member is rotated.

10. A door for a sealable wafer enclosure, the door comprising an enclosure with a front panel, a rear panel, four sidewalls forming a periphery and extending between the front panel and rear panel, and a latching mechanism the sidewalls having a plurality of recesses, the latching mechanism comprising a rotatable member linked to a plurality of latching portions extensible from the side walls, one of said front panel and rear panel being removeable and having an outside edge portion with a plurality of integral detents on spring members integral with the door panel, the detents extending outwardly toward the periphery to engage and catch with the plurality of recesses in the sidewalls thereby securing said removable panel in the sidewalls without metallic fasteners.

* * * * *